United States Patent
Pereira et al.

(10) Patent No.: US 7,164,377 B2
(45) Date of Patent: Jan. 16, 2007

(54) MULTIPLEXED VOLTAGE REFERENCE STRATEGY FOR CODEC

(75) Inventors: Vitor Pereira, Azueira (PT); Paulo Pereira, Sines (PT)

(73) Assignee: Integration Associates Inc., Mountain View, CA (US)

( * ) Notice: Subject to any disclaimer, the term of this patent is extended or adjusted under 35 U.S.C. 154(b) by 0 days.

(21) Appl. No.: 11/291,733

(22) Filed: Dec. 1, 2005

(65) Prior Publication Data

US 2006/0119501 A1    Jun. 8, 2006

Related U.S. Application Data

(60) Provisional application No. 60/633,478, filed on Dec. 6, 2004, provisional application No. 60/632,910, filed on Dec. 3, 2004.

(51) Int. Cl.
*H03M 1/66* (2006.01)
(52) U.S. Cl. ...................... 341/150; 341/122
(58) Field of Classification Search ............... 341/150, 341/122, 144, 155, 110
See application file for complete search history.

(56) References Cited

U.S. PATENT DOCUMENTS

| | | | | |
|---|---|---|---|---|
| 4,385,286 A | * | 5/1983 | Haque | 341/108 |
| 4,677,322 A | * | 6/1987 | Burson et al. | 327/42 |
| 5,177,484 A | * | 1/1993 | Bruckmann | 341/172 |
| 6,052,000 A | * | 4/2000 | Nagaraj | 327/94 |
| 6,147,522 A | * | 11/2000 | Rhode et al. | 327/93 |
| 6,639,414 B1 | * | 10/2003 | Lien | 324/658 |
| 6,645,305 B1 | * | 11/2003 | Oliver | 131/274 |
| 6,753,801 B1 | * | 6/2004 | Rossi | 341/161 |

* cited by examiner

*Primary Examiner*—Peguy JeanPierre
(74) *Attorney, Agent, or Firm*—Verron W. Francissen; Francissen Patent Law, P.C.

(57) ABSTRACT

A shared voltage reference circuit for a codec is shown that includes a voltage reference circuit for producing a reference voltage. A first sample and hold circuit has a first capacitor coupled to an output of the voltage reference circuit through a first switch controlled by a first phase of a sample clock signal for the codec. A second sample and hold circuit has a second capacitor coupled to the output of the voltage reference circuit through a second switch controlled by a second phase of the sample clock signal. A clock generator circuit generates the first and second phases of the sample clock signal, where the first and second phases are non-overlapping.

3 Claims, 3 Drawing Sheets

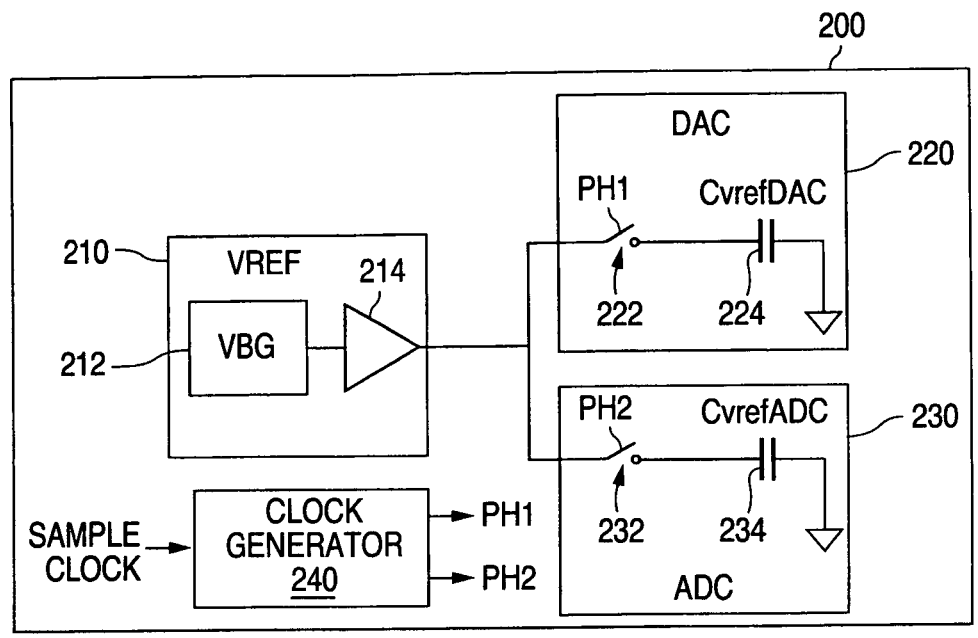
FIG. 4
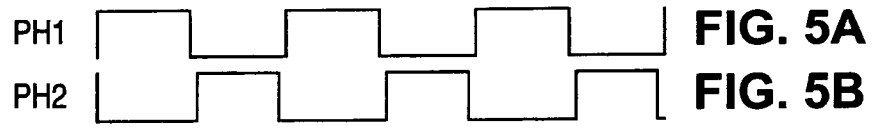
FIG. 5A
FIG. 5B
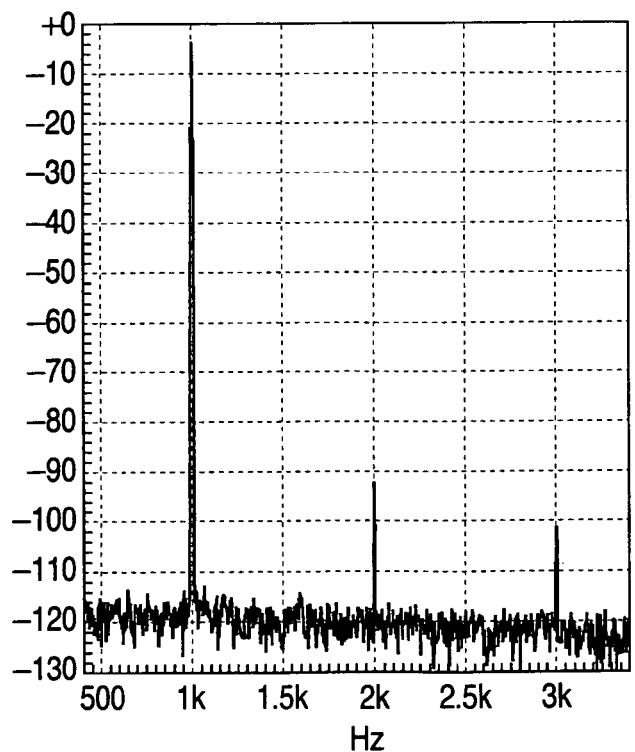
FIG. 6

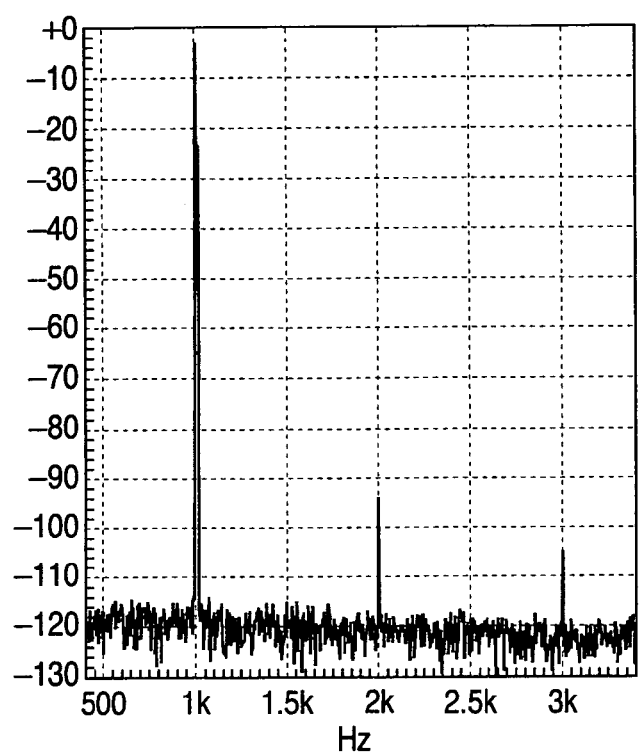
FIG. 7
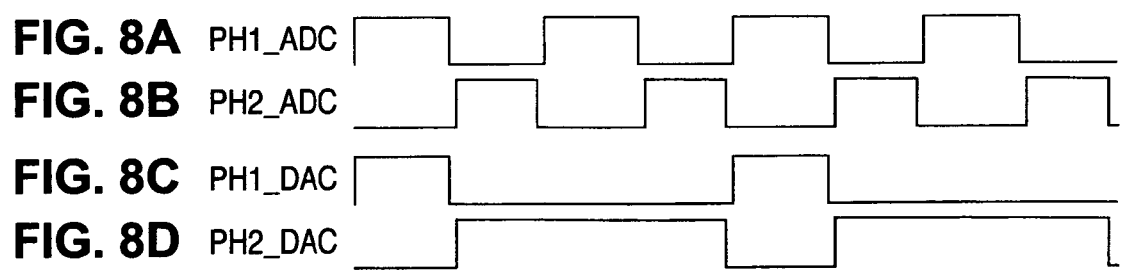
FIG. 8A PH1_ADC
FIG. 8B PH2_ADC
FIG. 8C PH1_DAC
FIG. 8D PH2_DAC

US 7,164,377 B2

MULTIPLEXED VOLTAGE REFERENCE STRATEGY FOR CODEC

CROSS REFERENCE TO RELATED APPLICATIONS

This application claims priority to U.S. Provisional Patent Application No. 60/632,910 filed Dec. 3, 2004, entitled MULTIPLEXED VOLTAGE REFERENCE STRATEGY FOR CODEC, herein incorporated by reference in its entirety. This application also claims priority to U.S. Provisional Patent Application No. 60/633,478 filed Dec. 6, 2004, entitled TELEPHONE INTERFACE CIRCUITRY, herein incorporated by reference in its entirety.

BACKGROUND OF THE INVENTION

In a coder/decoder (codec) there are typically two channels, a digital to analog transmit (TX) channel and an analog to digital receive (RX) channel. The TX channel contains a digital to analog converter (DAC) along with analog and digital signal conditioning circuits. The RX channel includes an analog to digital converter (ADC). Both of the DAC and ADC circuit blocks require a fundamental reference input, which may be a voltage, a current, or other input.

When looking into these blocks from a very high level perspective, the DAC output is the digital code multiplied by the reference and the ADC output is the input signal divided by the reference. This means that the DAC and ADC can only be as high performance as its reference. As a consequence of this fact, any non-linearity or inaccuracy in the reference will be propagated to the output of the DAC or ADC block, which makes the reference block a fundamental item in the codec.

The standard approach in full-duplex codecs is to use two reference buffers to isolate the reference of the DAC and ADC. This is a costly strategy because, in the case of a voltage reference, the two voltage buffers alone can represent more then 20% of the analog power consumption of the codec and up to 11% of the analog core area.

SUMMARY OF THE INVENTION

In an embodiment of a shared reference voltage strategy for a codec, a voltage reference is provided that is connected to a first capacitor through a first switch and to a second capacitor through a second switch. A first sample clock phase drives the first switch in order to charge the first capacitor to produce a reference voltage for a digital to analog converter of the codec. A second sample clock phase drives the second switch in order to charge the second capacitor to produce a reference voltage for an analog to digital converter of the codec. The first and second sample clock phases are non-overlapping.

An embodiment of a shared voltage reference circuit for a codec includes a voltage reference circuit having an output for producing a reference voltage. A first sample and hold circuit has a first capacitor coupled to the output of the voltage reference circuit through a first switch controlled by a first phase of a sample clock signal for the codec. A second sample and hold circuit has a second capacitor coupled to the output of the voltage reference circuit through a second switch controlled by a second phase of the sample clock signal. A clock generator circuit generates the first and second phases of the sample clock signal, where the first and second phases are non-overlapping.

BRIEF DESCRIPTION OF THE DRAWINGS

FIG. 4 is a functional block diagram illustrating an exemplary embodiment of a circuit for a single voltage reference strategy;

FIGS. 5A and 5B are waveform diagrams illustrating an example of the drive signals used in the single voltage reference strategy of FIG. 4; and FIG. 6 is a frequency response plot illustrating an example of the response of a circuit having a receive channel using a shared or single reference strategy such as that shown in FIG. 4;

FIG. 7 is a frequency response plot illustrating an example of the response of a circuit having a receive channel using a conventional reference strategy; and FIGS. 8A–D are waveform diagrams illustrating another example of the drive signals that may be used in the single voltage reference strategy of FIG. 4.

DETAILED DESCRIPTION OF EMBODIMENTS

When the DAC and ADC are based on switched capacitor techniques, then the architecture can be shaped in order to overcome the issue mentioned above. The circuit technique used in the present invention provides for sharing a voltage reference between the DAC and ADC without significant performance degradation.

Figure 1:
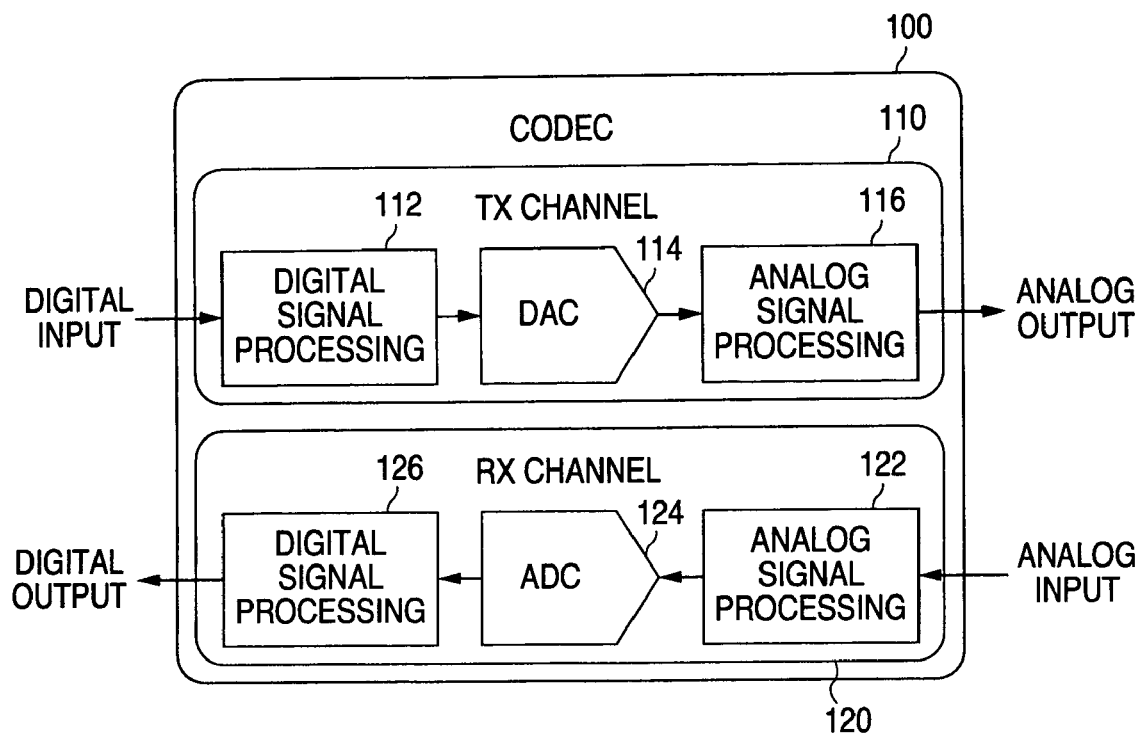
FIG. 1 is functional block diagram of codec circuit.

FIG. 1 is a functional block diagram illustrating an example of a codec 100 having a transmit channel 110 and a receive channel 120. The transmit channel 110 receives a digital input signal that is, in this example, subjected to digital signal processing, e.g. by a digital signal processor 112, input to a DAC 114 and then analog signal processed through transmit side analog circuitry 116, e.g. through filters and a transmit amplifier, to produce an analog output signal. The receive channel 120 receives an analog input signal that is subject to analog signal processing by receive side analog circuitry 122, e.g. through filters and a receive amplifier, input to an ADC 124, and digitally signal processed, e.g. through the same digital signal processor 112 or another digital signal processor 126.

Figure 2:
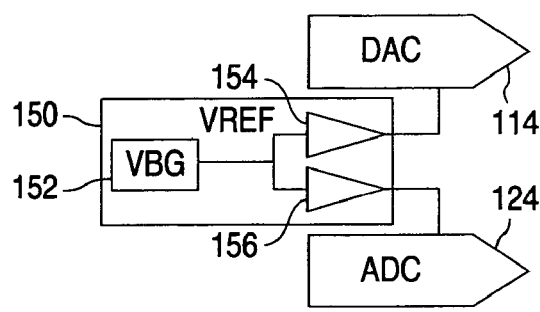
FIG. 2 is a functional block diagram illustrating an example of a conventional voltage reference strategy.

FIG. 2 is a functional block diagram of a circuit 150 illustrating a standard voltage reference strategy, wherein a bandgap voltage generator 152 produces a bandgap voltage signal that is input into a first voltage reference buffer 154 that produces a first voltage reference for the DAC 114 and a second voltage reference buffer 156 that produces a second voltage reference for the ADC 124. This solution requires two reference buffers 154 and 156 which typically requires more integrated circuit area or components.

Figure 3:
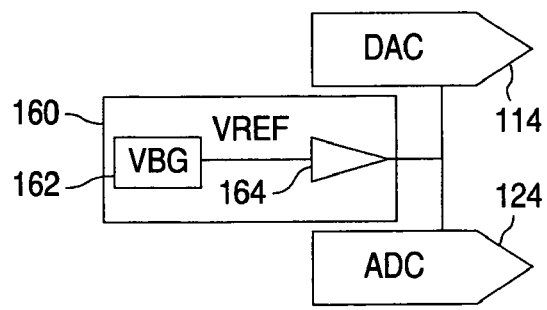
FIG. 3 is a functional block diagram illustrating an example of a conventional circuit for a shared single voltage reference strategy.

FIG. 3 is a functional block diagram of a circuit 160 illustrating an example of a single shared voltage reference buffer strategy, wherein a bandgap voltage reference generator 162 provides a bandgap reference voltage to a single voltage reference buffer 164 that is shared between the ADC 124 and DAC 114. In this example, buffer 164 must be large enough to provide the reference voltage needs of both DAC 114 and ADC 124. However, this solution is prone to reference crosstalk as the current demands of one converter draw down the reference voltage and cause a crosstalk noise signal to reach the other converter through the shared reference voltage. This can result in distortion of the received or transmitted signals.

FIG. 4 is a simplified functional block diagram illustrating an embodiment of a circuit 200 wherein a shared voltage reference buffer is used for both the DAC and ADC of a codec, such as the codec of FIG. 1. In FIG. 4, a voltage reference circuit 210 includes a bandgap voltage reference generator 212 and a voltage reference buffer 214. A voltage reference signal output from the voltage reference buffer 214 is input to both a sample and hold circuit for a DAC 220 and sample and hold circuit for an ADC 230 through switches 222 and 232, respectively. A first switch 222 is driven by a first sample clock phase signal PH1. The first switch 222 is coupled between the voltage reference buffer 214 and a first capacitor 224 such that the first capacitor 224 is charged through the first switch 222 under control of clock phase signal PH1, which is illustrated in a waveform diagram of FIG. 5A. When clock phase signal PH1 is a logical high, then switch 222 closes and the output of voltage reference buffer 214 charges capacitor 224 to the voltage level provided by voltage reference 210. When clock phase signal PH1 is a logical low, then switch 222 opens and the voltage level for DAC 220 is essentially maintained by the charge on capacitor 224 during the low logic cycle of the clock phase signal PH1. A clock generator circuit 240 receives a sample clock signal for the codec and generates the non-overlapping first and second clock phase signals PH1 and PH2.

A second switch 232 is coupled between the voltage reference buffer 214 and a second capacitor 234 such that capacitor 234 is charged through switch 232 under control of clock phase signal PH2, which is illustrated in a waveform diagram of FIG. 5B. When clock phase signal PH2 is a logical high, then switch 232 closes and the output of voltage reference buffer 214 charges capacitor 234 to the voltage level provided by voltage reference 210. When clock phase signal PH2 is a logical low, then switch 232 opens and the voltage level for ADC 230 is essentially maintained by the charge on capacitor 234 during the low logic cycle of the clock phase signal PH2. Note in the waveform diagrams of FIGS. 5A and 5B illustrating an example of sample clock phase signals PH1 and PH2 that the clock phase signals are non-overlapping in time. This effectively isolates capacitor 224 from 234 so that the DAC reference voltage maintained on capacitor 224 is not effected by the ADC reference voltage maintained on capacitor 234 and vice-versa.

In order to utilize the shared reference voltage circuit of FIG. 4, it must be determined whether the DAC and ADC reference voltage needs are compatible both in a time domain and in terms of voltage amplitude requirements. The time domain requirement may be met by using essentially the same sample clock for both the DAC 220 and ADC 230 or other clock signals that result in non-simultaneous reference sampling. For example, one converter may operate from one phase of the sample clock, e.g. PH1, while the other converter operates from another non-overlapping phase of the sample clock, e.g. PH2.

In another example, the DAC sample rate is half the sample rate for the ADC. Clock generator circuit 240 is modified in this example to produce four clock phase signals: PH1_ADC and PH2_ADC for driving ADC 230 and PH1_DAC and PH2_DAC for driving DAC 220, shown in FIGS. 8A–D, respectively. In this example, ADC 230 samples the reference voltage when PH2_ADC is high and the DAC samples the reference voltage when PH1_DAC is high. The sampling is non-overlapping to avoid crosstalk between the two channels. The DAC implementation in the circuit can be relaxed due to its lower sampling rate because of the wider phase (PH2_DAC) for charge transfer or redistribution.

Voltage compatibility is obtained by setting the gain paths in a way that the input reference voltage value will be the same for the DAC 220 and ADC 230. This way, only one buffer 214 is needed. Still, the DAC 220 must be isolated from the ADC 230 in order to avoid reference crosstalk. However, this is preferably achieved without making single shared buffer 214 consume nearly as much power and area as the two buffers in the conventional solution, e.g. reference circuit 160 in FIG. 3.

In the switched capacitor circuit of FIG. 4, in order to avoid any non-linear and distortion causing effects, the reference buffer 214 is designed such that the sample capacitors 224 and 234 will have the desired voltage reference level by the end of the logical high cycle of the sample clock phase signals PH1 and PH2, respectively. Thus, reference buffer 214 is designed to source sufficient current to charge each of the capacitors 224 and 234 to the reference voltage level within approximately half a sample clock signal.

In the switched capacitor circuit of FIG. 4, a pair of non-overlapped sample clock phases PH1 and PH2 is used in order to allow well defined charge transfer operations. In the embodiment shown, the non-overlapped clock phases PH1 and PH2 are used to synchronize the charging of the ADC and DAC sample capacitors 224 and 234, respectively, from the reference voltage provided by buffer 214. The non-overlapped clock phase signals PH1 and PH2 also serve to isolate ADC and DAC sample capacitors 224 and 234 from one another to avoid crosstalk between the transmit and receive channels of the codec. If the sample switches 222 and 232 for acquiring the reference voltage levels for the converters are controlled with non-overlapping sample clock phases, then a single buffer 214 is sufficient to provide the reference voltage for both the DAC 220 and ADC 230 of a complete codec.

If buffer 214 is designed to provided sufficient current to charge the sample capacitors 224 and 234 within half the sample clock cycle, e.g. during the logic high cycle of non-overlapped clock phase signals PH1 and PH2, then performance will not be degraded by the use of a single reference buffer 214. The buffer 214 will charge capacitors 224 and 234 to the reference voltage level during separate clock phases making the ADC 230 electrically invisible to the DAC 220 and vice-versa.

The shared reference strategy described herein was verified by testing the same codec design in an integrated circuit with the standard reference approach, e.g. the two buffer solution of FIG. 2, and in another integrated circuit with the shared reference voltage strategy of FIG. 4. In both cases, the transmit and receive channel inputs were fed with a 1 kHz, −3 dB, full scale sine wave.

Table 1 below summarizes the results obtained for the transmit and receive channels using the shared or single reference strategy of FIG. 4 and an example of a standard reference strategy where separate reference buffers are employed. In addition, FIGS. 6 and 7 are frequency response Fast Fourier Transform (FFT) graphs obtained illustrating the response of receive channels using the shared reference strategy and the standard reference strategy, respectively. The performance gap between the two configurations in the comparison is less than 0.5 dB. The comparison indicates that the single reference strategy performance is very close to the standard reference strategy, but with reduced analog core area and current consumption requirements (e.g.

enabling the analog core area to be reduced by approximately 5.5% and the current consumption by approximately 10%).

TABLE 1

|  | Reference | SNR | THD |
|---|---|---|---|
| TX | Shared Reference Strategy | 90.47 | −96.80 |
|  | Standard Reference Strategy | 90.33 | −96.96 |
| RX | Shared Reference Strategy | 88.36 | −87.89 |
|  | Standard Reference Strategy | 88.77 | −89.26 |

The present circuit may be combined with the circuits described in the following commonly owned patent applications filed Dec. 3, 2004, herein incorporated by reference in their entirety: U.S. patent application Ser. No. 60/633,389 for Flexible Hook Switch Driver Circuit, and its corresponding utility application U.S. patent application Ser. No. 11/291,732; U.S. patent application Ser. No. 60/633,051 for Flexible Hybrid Structure Tunable for Different Telecom Market Solutions and its corresponding utility application U.S. patent application Ser. No. 11/291,717; and U.S. patent application Ser. No. 60/632,839 for Ring Detect and Snoop Circuit and its corresponding utility application U.S. patent application Ser. No. 11/291,731.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Certain embodiments of this invention are described herein, including the best mode known to the inventors for carrying out the invention. It should be understood that the illustrated embodiments are exemplary only, and should not be taken as limiting the scope of the invention.

The invention claimed is:

1. A method for sharing a voltage reference in a codec circuit, the method comprising the steps of:
    providing a voltage reference circuit having an output for producing a reference voltage;
    connecting the output of the voltage reference circuit to a first capacitor through a first switch;
    connecting the output of the voltage reference circuit to a second capacitor through a second switch;
    driving the first switch with a first phase of a sample clock signal in order to charge the first capacitor to produce a sampled reference voltage for a digital to analog converter of the codec; and
    driving the second switch with a second phase of the sample clock signal in order to charge the second capacitor to produce a sampled reference voltage for an analog to digital converter of the codec,
    where the first and second phases of the sample clock are non-overlapping.

2. A shared voltage reference circuit for a codec, the circuit comprising:
    a voltage reference circuit having an output for producing a reference voltage;
    a first sample and hold circuit having a first capacitor coupled to the output of the voltage reference circuit through a first switch controlled by a first phase of a sample clock signal for the codec;
    a second sample and hold circuit having a second capacitor coupled to the output of the voltage reference circuit through a second switch controlled by a second phase of the sample clock signal; and
    a clock generator circuit for generating the first and second phases of the sample clock signal, where the first and second phases are non-overlapping.

3. A circuit for sharing a voltage reference in a codec circuit, the circuit comprising:
    voltage reference means for producing a reference voltage;
    first sample and hold means for sampling and holding the reference voltage responsive to a first phase of a sample clock signal to produce a first sampled reference voltage for an analog to digital converter of the codec;
    second sample and hold means for sampling and holding the reference voltage responsive to a second phase of the sample clock signal to produce a second sampled reference voltage for a digital to analog converter of the codec;
    clock generator means for generating the first and second phases of the sample clock signal, where the first and second phases of the sample clock are non-overlapping.

* * * * *